United States Patent [19]

Pfeifer

[11] Patent Number: 4,808,732
[45] Date of Patent: Feb. 28, 1989

[54] AMINO-TETRAALKYLBENZOYLPH-THALIC ACIDS

[75] Inventor: Josef Pfeifer, Therwil, Switzerland

[73] Assignee: Ciba-Geigy Corporation, Ardsley, N.Y.

[21] Appl. No.: 115,544

[22] Filed: Oct. 28, 1987

Related U.S. Application Data

[60] Continuation of Ser. No. 895,601, Aug. 7, 1986, abandoned, which is a division of Ser. No. 795,591, Nov. 6, 1985, Pat. No. 4,629,685.

[30] Foreign Application Priority Data

Nov. 16, 1984 [CH] Switzerland ................ 5487/84

[51] Int. Cl.⁴ ............................................ C07D 307/77
[52] U.S. Cl. ................................. 549/244; 562/441; 560/76; 564/163
[58] Field of Search ................ 562/441; 549/244; 560/76; 564/163

[56] References Cited

U.S. PATENT DOCUMENTS

| | | | |
|---|---|---|---|
| 3,609,123 | 9/1971 | Rabilloud et al. | 562/441 |
| 3,639,340 | 2/1972 | Balone et al. | 528/184 |
| 3,678,005 | 7/1972 | Robilloud et al. | 528/184 |
| 3,726,831 | 4/1973 | Acle et al. | 528/184 |
| 4,004,998 | 1/1977 | Rosen | 560/36 |
| 4,377,536 | 3/1983 | Waitkus et al. | 562/441 |
| 4,451,669 | 5/1984 | D'Alelio et al. | 562/441 |

FOREIGN PATENT DOCUMENTS 1595520  7/1970  France .................... 549/244

Primary Examiner—James H. Reamer
Attorney, Agent, or Firm—Harry Falber; Luther A. R. Hall

[57] ABSTRACT

Amino-tetraalkylbenzoylphthalic acids are intermediates for preparing homopolyimides and copolyimides which contain structural elements of the formula I

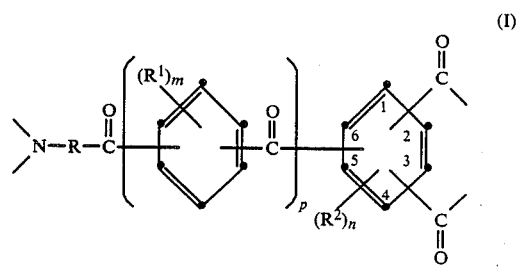

in which $R^1$ and $R^2$ are halogen, nitro, aryl, aryloxy, alkyl or alkoxy, m is 0 or a number from 1 to 4, n is 0 or a number from 1 to 3 and p is 0, 1 or 2, the free carbonyl groups are bonded in the ortho-position relative to one another and R is a divalent aromatic radical which is substituted by at least one alkyl group or aralkyl group, are autophotocrosslinkable. They are suitable for the production of protective films and photographic relief images.

4 Claims, No Drawings

AMINO-TETRAALKYLBENZOYLPHTHALIC ACIDS

This is a continuation of application Ser. No. 895,601, filed on Aug. 7, 1986 now abandoned which in turn is a divisional of application Ser. No. 795,591, filed on Nov. 6, 1985, now U.S. Pat. No. 4,629,685, issued on Dec. 16, 1986.

The present invention relates to homopolyimides and copolyimides of substituted aromatic aminodicarboxylic acids, aromatic tetracarboxylic acids and diamines and/or unsubstituted aromatic aminodicarboxylic acids, a process for their preparation and their use for the preparation of protective films or photographic relief images.

Polyimides are plastics with useful thermomechanical properties. Because of their high melting ranges, however, they cannot be processed by the usual shaping methods for thermoplastics. Soluble polyimides which can be used as varnishes for forming coating layers with a high stability towards heat have therefore been developed, c.f. German Auslegeschrift No. 1,962,588 and U.S. Pat. No. 3,787,367. With the development of electronics and semiconductor technology, high requirements are being imposed on the heat stability of polyimides, for example as insulating and protective films, which the known polyimides are not always capable of meeting.

It has now been found that soluble autophotocrosslinkable polyimides of high heat stability are obtained if they contain structural elements of an aromatic aminoketodicarboxylic acid substituted by alkyl or aralkyl.

The present invention relates to homopolyimides and copolyimides which contain structural elements of aromatic aminodicarboxylic acids and have an intrinsic viscosity of at least 0.1 dl/g, measured at 25° C. in a solution of 0.5 percent by weight of polyimide in N-methylpyrrolidone, which contain recurring structural elements of the formula I

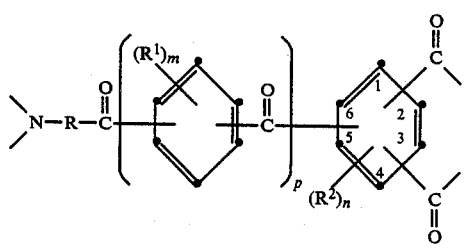

in which $R^1$ and $R^2$ are halogen, nitro, aryl, aryloxy, alkyl or alkoxy, m is 0 or a number from 1 to 4, n is 0 or a number from 1 to 3 and p is 0, 1 or 2, the free carbonyl groups are bonded in the ortho-position relative to one another and R is a divalent aromatic radical which is substituted by at least one alkyl group or aralkyl group.

The intrinsic viscosity is preferably at least 0.2 dl/g, in particular 0.2 to 2.0 dl/g. In formula i, m, n and p are preferably 0.

$R^1$ and $R^2$ as halogen are preferably F or Cl, as aryl are phenyl, as aryloxy are phenoxy and as alkyl and alkoxy preferably contain 1 to 12, in particular 1 to 4, C atoms. Examples are methyl, ethyl, n-propyl, i-propyl, butyl, methoxy and ethoxy. The carbonyl groups are preferably bonded in the 2-, 3- and 6-position.

The aromatic radical R is preferably substituted by alkyl or aralkyl in at least one, in particular in both, ortho-positions relative to the N atom. The substituent as aralkyl is, in particular, benzyl. As alkyl, the substituent preferably contains 1 to 12, in particular 1 to 4, C atoms. The alkyl can be linear or branched. Ethyl, methyl, and isopropyl are particularly preferred. Other examples are n-propyl, n-butyl, isobutyl, pentyl, hexyl, octyl, decyl and dodecyl.

The aromatic radical R is preferably a phenylene radical or bisphenylene radical substituted by alkyl. In particular, the radical R has the formula II

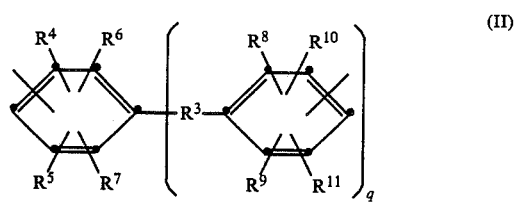

in which q is 0 or 1, $R^3$ is a direct bond or a bridge group, $R^4$ is alkyl with 1 to 4 C atoms and $R^5$ to $R^{11}$ are hydrogen atoms or alkyl with 1 to 4 C atoms, and the free bonds are in the meta- or para-position relative to the $R^3$ group.

In one embodiment, $R^4$ and $R^5$, and $R^{10}$ and $R^{11}$ are bonded in the ortho-position relative to the free bond and are $C_1-C_4$-alkyl. In a particularly preferred embodiment, q in formula II is 0 and $R^4$ to $R^7$ are $C_1-C_4$-alkyl, in particular methyl or ethyl.

The bridge group $R^3$ can have the same meaning as $R^{13}$. $R^3$ is preferably a direct bond, —S—, —O—, —SO—, —SO$_2$—, —CO—, —CH$_2$— or $C_2-C_6$-alkylidene, for example ethylidene, 1,1- or 2,2-propylidene, cyclopentylidene or cyclohexylidene.

In a particular embodiment, the polyimides according to the invention contain structural elements of the formula

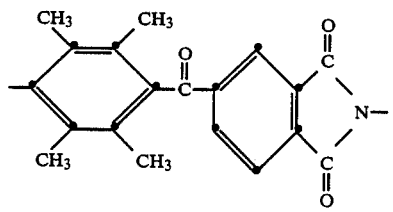

In another embodiment, the polyimides contain (a) 0.1–100 mol % of structural elements of the formula I and (b) 99.9–0 mol % of structural elements of the formula III and/or IIIa

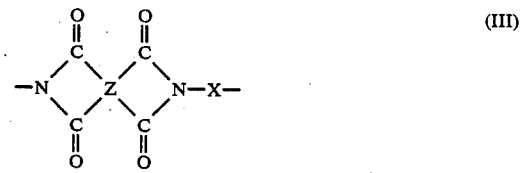

-continued

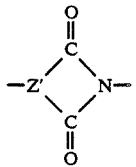
(IIIa)

in which Z is the tetravalent radical of an aromatic tetracarboxylic acid onto which in each case two carbonyl groups are bonded in the ortho- or peri-position, Z' is the trivalent radical of an aromatic aminocarboxylic acid onto which two carbonyl groups are bonded in the ortho- or peri-position and X is the divalent radical of an organic diamine.

The structural elements of the formula I are preferably present in an amount of 5–100 mol %, preferably 20–100 mol %, in particular 50–100 mol % and especially 80–100 mol %, and the structural elements of the formulae III or IIIa are preferably present in an amount of 95–0 mol %, preferably 80 to 0 mol %, in particular 50 to 0 mol % and especially 20 to 0 mol %.

X in formula III can be a divalent unsubstituted of substituted aliphatic radical, which can be interrupted by heteroatoms or aromatic, heterocyclic or cycloaliphatic groups, an unsubstituted or substituted heterocyclic, cycloaliphatic or aralaphatic radical, an aromatic radical in which two aryl nuclei are linked via an aliphatic group, or an aromatic radical which is substituted by at least one alkyl group, cycloalkyl group, alkoxyalkyl group, alkoxy group, alkylthio group, alkylthioalkyl group, hydroxyalkyl group, hydroxyalkoxy group, hydroxyalkylthio group or aralkylthio group or, on two adjacent C atoms of the aromatic radical, by an alkylene group.

X is preferably alkylene, cycloalkylene, aralkylene or arylene, and especially substituted arylene.

X in formula III as a divalent aliphatic radical preferably contains 2 to 30, in particular 6 to 30 and especially 6 to 20, C atoms. In a preferred sub-group, X is linear or branched alkylene, which can be interrupted by oxygen atoms, S, SO, $SO_2$, NH, $NR^a$, $\oplus NR_2^a\, G^\ominus$, cyclohexylene, naphthylene, phenylene or hydantoin radicals. $R^a$ can be, for example, alkyl with 1 to 12 C atoms or cycloalkyl with 5 or 6 ring C atoms, phenyl or benzyl. $G^\ominus$ is an anion of a proton acid, for example halide, sulfate or phosphate. In a preferred embodiment, R and R' are linear or branched alkylene with 6 to 30 C atoms, $-(CH_2)_{m'}-R^{14}-(CH_2)_{n'}-$, in which $R^{14}$ is phenylene, naphthylene, cyclopentylene or cyclohexylene and $m'$ and $n'$ independently of one another are the number 1, 2 or 3 $-R^{15}-(OR^{16})_p-O-R^{15}-$, in which $R^{15}$ is ethylene, 1,2-propylene, 1,3-propylene or 2-methyl-1,3-propylene and $R^{16}$ is ethylene, 1,2-propylene, 1,2-butylene, 1,3-propylene or 1,4-butylene and p is a number from 1 to 100, or

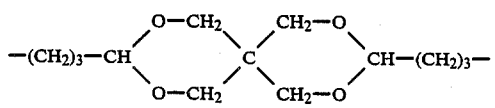

Examples of aliphatic radicals are: methylene, ethylene, 1,2- or 1,3-propylene, 2,2-dimethyl-1,3-propylene, 1,2-, 1,3- or 1,4-butylene, 1,3- or 1,5-pentylene, hexylenes, heptylenes, octylenes, decylenes, dodecylenes, tetradecylenes, hexadecylenes, octadecylenes, eicosylenes, 2,4,4-trimethylhexylene, 1,10-dialkyldecylene, in which the alkyl preferably contains 1 to 6 C atoms, substituted 1,11-undecylenes, such as are described, for example, in B No. 0,11,559, jeffamines, for example

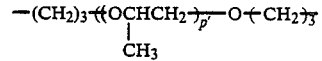

where $p'=1$ to 100, or $-(CH_2)_3(O(CH_2)_4)_{p'}O(CH_2)_3$ where $p'=1-100$, dimethylenecyclohexane, xylylene and diethylbenzene. X is particularly preferably longer-chain, branched alkylene with, for example, 8 to 30 C atoms.

X in formula I as an aliphatic radical can also be a polysiloxane radical of the formula

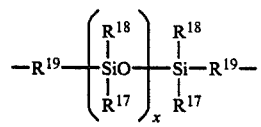

in which $R^{18}$ and $R^{17}$ are $C_1$–$C_6$-alkyl, in particular methyl, or phenyl, $R^{19}$ is cycloalkylene, for example cyclohexylene, and in particular $C_1$–$C_{12}$-, especially $C_1$–$C_6$-alkylene, for example 1,3-propylene or 1,4-butylene, and x is a rational number of at least 1, for example 1 to 100, preferably 1 to 10. Such diamines containing this radical are described in U.S. Pat. No. 3,435,002 and U.S. Pat. No. 4,030,948.

The aliphatic radicals interrupted by heterocyclic radicals can be, for example, those which are derived from N,N'-aminoalkylated hydantoins or benzimidazoles. Examples are N,N'-($\gamma$-aminopropyl)-5,5-dimethyl-hydantoin or -benzimidazolone and those of the formula

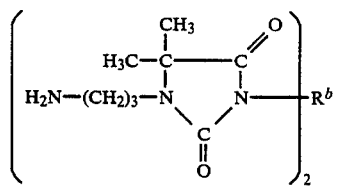

in which $R^b$ is alkylene with 1 to 12, preferably 1 to 4, C atoms, or

in which $R^c$ is a hydrogen atom or methyl and a is an integer from 1 to 20.

Examples of suitable substituents for the aliphatic radicals are hydroxyl, halide, such as F or Cl, and alkoxy with 1 to 6 C atoms.

Heterocyclic diamine radicals are preferably derived from N-heterocyclic diamines, for example from pyrrolidine, indole, piperidine, pyridine and pyrrole, the N atom of which can be alkylated, for example methylated. An example is N-methyl-4-amino-5-aminomethylpiperidine.

X in formula I as a divalent cycloaliphatic radical preferably contains 5 to 8 ring C atoms and is, in particular, mononuclear or dinuclear cycloalkylene which has 5 to 7 ring C atoms and is unsubstituted or substituted by alkyl, which preferably contains 1 to 4 C atoms. In a preferred embodiment, X as a cycloaliphatic radical is a radical of the formula

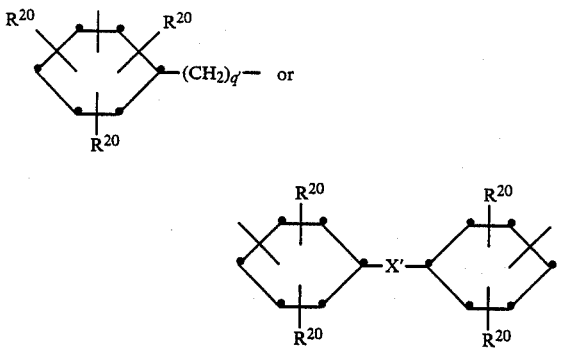

in which q' is 0 or 1, the radicals $R^{20}$ independently of one another are hydrogen or alkyl with 1 to 6 C atoms and X' is a direct bond, O, S, $SO_2$, alkylene with 1 to 3 C atoms or alkylidene with 2 to 6 C atoms. $R^{20}$ is preferably ethyl or methyl, X' is preferably methylene and the alkylidene preferably contains 2 or 3 C atoms, such as ethylidene and 1,1- or 2,2-propylidene.

Examples of X as cycloalkylene are: 1,2- or 1,3-cyclopentylene, 1,2-, 1,3- or 1,4-cyclohexylene, cycloheptylene, cyclooctylene, methylcyclopentylene, methyl- or dimethylcyclohexylene, 3- or 4-methylcyclohex-1-yl, 5-methyl-3-methylenecyclohex-1-yl, 3,3'- or 4,4'-biscyclohexylene, 3,3'-dimethyl-4,4'-biscyclohexylene, 4,4'-biscyclohexylene ether or sulfone or -methane or -2,2-propane and the radicals of bis-aminomethyl-tricyclodecane, bis-aminomethylnorbornane and menthanediamine.

X as a cycloaliphatic radical is particularly preferably 1,4- or 1,3-cyclohexylene, 2,2,6-trimethyl-6-methylenecyclohex-4-yl, methylenebis(cyclohex-4-yl) or methylenebis(3-methylcyclohex-4-yl).

X as an araliphatic radical preferably contains 7 to 30 C atoms. If the aromatic group of the araliphatic radical is bonded to the N atoms in the radical of the formula III, which is preferred, these aromatic groups are preferably substituted in the same way as X as an aromatic radical, including the preferred substitution. The araliphatic radical preferably contains 7 to 30, in particular 8 to 22, C atoms. The aromatic radical in the araliphatic radical is preferably a phenyl radical. X as an araliphatic radical is, in particular, aralkylene which is unsubstituted or substituted on the aryl by alkyl, the alkylene radical being linear or branched. In a preferred embodiment, the araliphatic radical has the formula

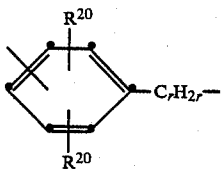

in which the radicals $R^{20}$ independently of one another are hydrogen atoms or, in particular alkyl with 1–6 C atoms and the symbols r are integers from 1 to 20.

The free bond can be in the o-position, m-position and, in particular, in the p-position relative to the $C_rH_{2r}$ group, and one or both radicals $R^{20}$ are preferably bonded in the o-position relative to the free bond.

Examples of X as an araliphatic radical are: m- or p-benzylene, 3-methyl-p-benzylene, 3-ethyl-p-benzylene, 3,5-dimethyl-p-benzylene, 3,5-diethyl-p-benzylene, 3-methyl-5-ethyl-p-benzylene, p-phenylenepropylene, 3-methyl-p-phenylenepropylene, p-phenylenebutylene, 3-ethyl-p-phenylenepentylene and, in particular, longer-chain phenylenealkylene radicals, which are described, for example, in A No. 0,069,062: 6-(p-phenylene)-6-methylhept-2-yl, 6-(3'-methyl-p-phenylene)-6-methylhept-2-yl, 6-(3'-ethyl-p-phenylene)-6-methylhept-2-yl, 6-(3',5'-dimethyl-p-phenylene)-6-methylhept-2-yl, 11-(p-phenylene)-2,11-dimethyl-dodec-1-yl and 13-(p-phenylene)-2,12-dimethyltetradec-3-yl.

X can also be an aromatic radical in which two aryl nuclei, in particular phenyl, are linked via an aliphatic group. This radical preferably has the formula

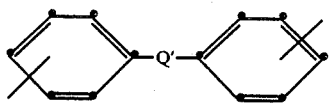

in which the free bonds are in the p-, m- and, in particular, o-position relative to the Q' grop and Q' is $C_1$-$C_{12}$-, in particular $C_1$-$C_{16}$-alkylene, which can be interrupted by O or S. Examples of Q' are ethylene, 1,2- or 1,3-propylene, butylene, $-CH_2-O-CH_2-$, $-CH_2-S-CH_2-$ and $-CH_2CH_2-O-CH_2CH_2-$.

Particularly preferred copolyimides are those with structural elements of the formula III in which X is substituted aromatic radicals. The substituent on the aromatic radical preferably contains 1 to 20, in particular 1–12 and especially 1–6 C atoms. The substituent is, in particular, $C_5$- or $C_6$-cycloalkyl, linear or branched alkyl, alkoxy, alkoxyalkyl, alkylthio, alkylthioalkyl, hydroxyalkyl, hydroxyalkoxy or hydroxyalkylthio with 1 to 6 C atoms, benzyl, trimethylene or tetramethylene. The preferred alkoxyalkyl is alkoxymethyl and the preferred alkoxy is methoxy. Examples of the substituents are: methyl, ethyl, propyl, isopropyl, n-butyl, isobutyl, pentyl, hexyl, octyl, dodecyl, tetradecyl, eicosyl, methoxy, ethoxy, propoxy, butoxy, pentoxy, hexoxy, methoxymethyl, metoxyethyl, ethoxymethyl, propoxymethyl, butoxymethyl, benzyl, methylbenzyl, phenylethyl, methylthio, ethylthio, hydroxyethyl, methylthioethyl and hydroxyethylthio. Preferred radicals are methoxymethyl, ethoxymethyl, methyl, ethyl, n-propyl, i-propyl, trimethylene and tetramethylene, cyclopentyl and cyclohexyl. Methyl, ethyl and i-propyl are particularly preferred. The substituted aromatic radical can be a mononuclear or polynuclear, in particular dinuclear, radical. Mononuclear radicals can contain 1 to 4, preferably 1 or 2, substituents and dinuclear radicals can contain up to 4, preferably 1 or 2, substituents in each nucleus. It has been found that copolyimides have a high photosensitivity if one or two substituents are bonded in the ortho-position relative to the N atom. Substitution in the ortho-position is therefore preferred. The aromatic radical is preferably bonded in the meta- or para-position relative to the N atom.

X as a substituted aromatic radical can contain 7 to 30, in particular 7 to 20, C atoms. The aromatic radical is preferably a hydrocarbon radical, for example phenylene, naphthylene or bisphenylenes, or a pyridine radical, these being substituted as defined above.

A preferred sub-group are those aromatic radicals of the formulae

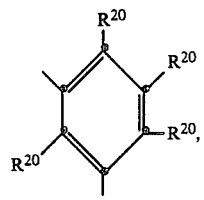

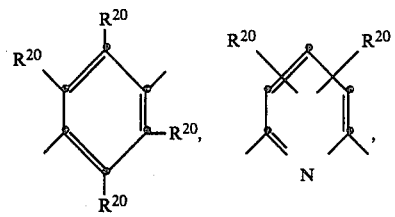

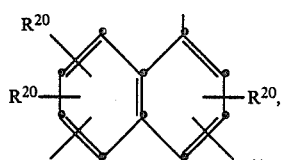

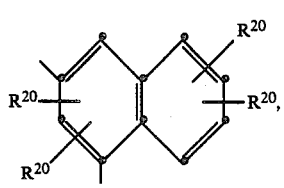

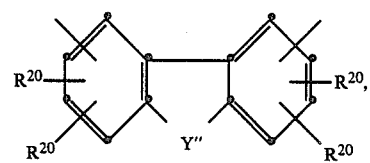

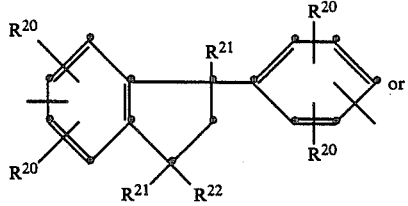

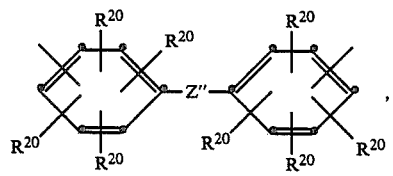

in which $R^{20}$, in the case of monosubstitution, is alkyl with 1 to 6 C atoms and the other radicals $R^{20}$ are hydrogen, and in the case of di-, tri- or tetra-substitution, two radicals $R^{20}$ are alkyl with 1 to 6 C atoms and the other radicals $R^{20}$ are hydrogen atoms or alkyl with 1 to 6 C atoms, or in the case of di-, tri- or tetra-substitution, two vicinal radicals $R^{20}$ in the phenyl ring are trimethylene or tetramethylene and the other radicals $R^{20}$ are hydrogen atoms or alkyl with 1 to 6 C atoms, Y'' is O, S, NH, CO or $CH_2$, $R^{21}$ is a hydrogen atom or alkyl with 1 to 5 C atoms and $R^{22}$ is alkyl with 1 to 5 C atoms, and Z'' is a direct bond, O, S, SO, $SO_2$,

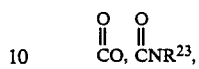

$NR^{23}$, CONH, NH, $R^{23}SiR^{24}$, $R^{23}OsiOR^{24}$,

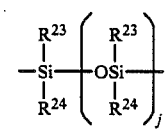

alkylene with 1 to 6 C atoms, which can be interrupted by —O— or —S—, alkenylene or alkylidene with 2 to 6 C atoms, phenylene or phenyldioxyl, in which $R^{23}$ and $R^{24}$ independently of one another are alkyl with 1 to 6 C atoms or phenyl and j is 1–10, in particular 1–3. Z'' can furthermore have the formula

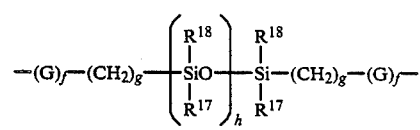

in which G is S or, in particular, O, f is 0 or, in particular, 1, g is 1–6 and h is 1 to 50, in particular 1 to 10, and $R^{18}$ and $R^{17}$ are as defined above, or can be a radical of the formula

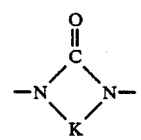

in which K is

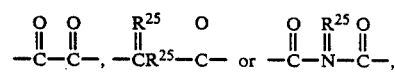

where $R^{25}$ is H, $C_1$–$C_6$-alkyl or phenyl. $R^{21}$ and $R^{22}$ are preferably methyl, Y'' is preferably —$CH_2$— or —O— and Z'' is preferably a direct bond, —O—, —$CH_2$— or alkylidene with 2 to 4 C atoms. $R^{23}$ and $R^{24}$ are, in particular, methyl, ethyl and phenyl. The alkylene preferably contains 2 to 4 C atoms and is, in particular, ethylene. Alkenylene is, in particular, ethenylene.

A preferred sub-group are toluylene radicals and radicals of o,o'-substituted diaminodiphenylenes, diaminodiphenylmethanes and diaminodiphenyl ethers.

A particularly preferred group are those aromatic radicals of the formulae

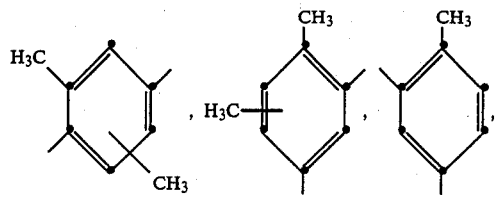 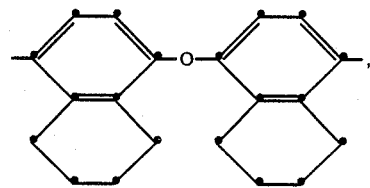

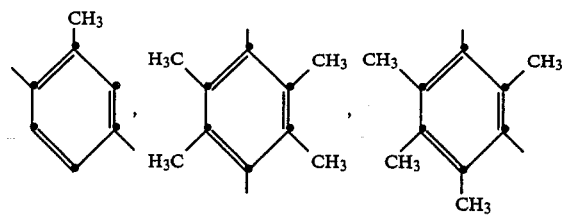 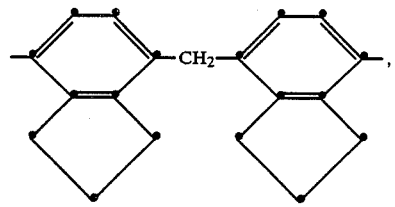

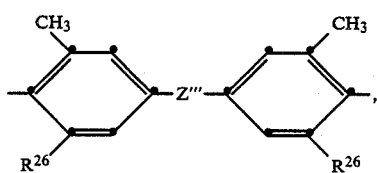 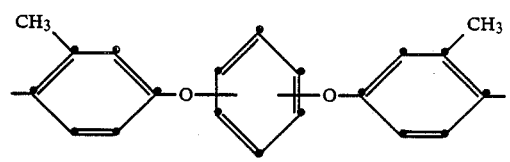

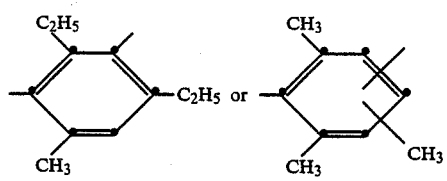 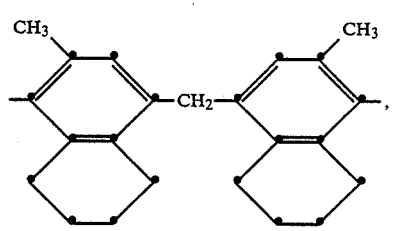

in which Z''' is a direct bond, O or, in particular, CH$_2$ and R$^{26}$ is a hydrogen atom, methyl, ethyl or isopropyl.

Examples of substituted aromatic radicals X are: 4-methyl-1,3-phenylene, 4-ethyl-1,3-phenylene, 2-methyl-1,3-phenylene, 4-benzyl-1,3-phenylene, 4-methoxymethyl-1,3-phenylene, tetrahydro-1,3- or -1,4-naphthylene, 3-propyl-1,3- or -1,4-phenylene, 3-isopropyl-1,4-phenylene, 3,5-dimethyl-1,4-phenylene, 2,4-dimethyl-1,3-phenylene, 2,3-dimethyl-1,4-phenylene, 5-methyl-1,3-phenylene, 2,3,5,6-tetramethyl-1,4- or -1,3-phenylene, 3-methyl-2,6-pyridylene, 3,5-dimethyl-2,6-pyridylene, 3-ethyl-2,6-pyridylene, 1-methyl-2,7-naphthylene, 1,6-dimethyl-2,7-naphthylene,

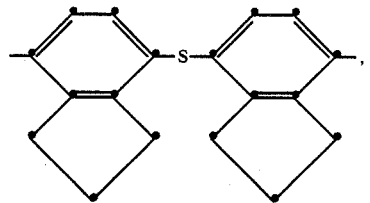

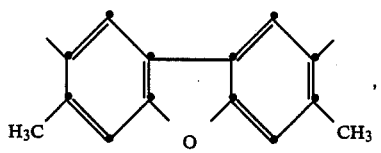 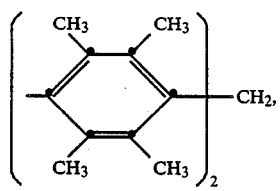

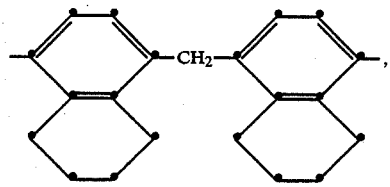 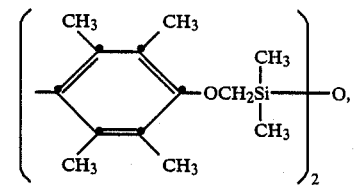

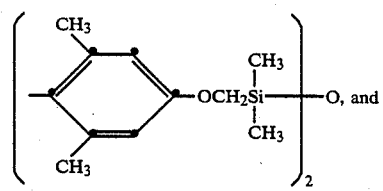

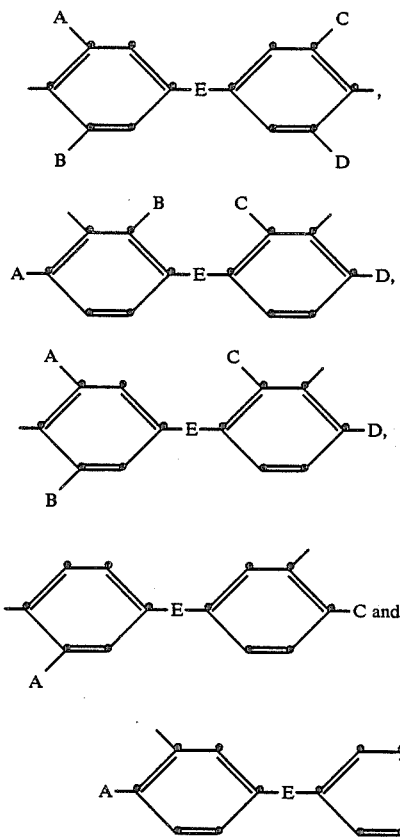

in which A, B, C, D and E are as defined in the following table. The free positions in the phenyl nuclei here can be occupied by one or two other substituents G or H in each nucleus, and G or H can have the meaning of A to D given in the following table:

| E | A | B | C | D |
|---|---|---|---|---|
| CH$_2$ | Methyl | Methyl | H | H |
| CH$_2$ | Methyl | Ethyl | H | H |
| CH$_2$ | Ethyl | Ethyl | H | H |
| CH$_2$ | Isopropyl | Isopropyl | H | H |
| CH$_2$ | Methoxymethyl | | H | H |
| CH$_2$ | Benzyl | Benzyl | H | H |
| CH$_2$ | Methyl | Methyl | Methyl | H |
| CH$_2$ | Ethyl | Ethyl | Ethyl | H |
| CH$_2$ | Isopropyl | Isopropyl | Methyl | Methyl |
| CH$_2$ | Methoxymethyl | | Methyl | H |
| CH$_2$ | Methyl | Ethyl | Methyl | H |
| CH$_2$ | Methoxymethyl | | Methoxymethyl | |
| CH$_2$ | Methyl | Methyl | Methyl | Methyl |
| CH$_2$ | Ethyl | Ethyl | Ethyl | Ethyl |
| CH$_2$ | Methyl | Methyl | Ethyl | Ethyl |
| CH$_2$ | Ethyl | Ethyl | Isopropyl | Isopropyl |
| CH$_2$ | Isopropyl | Isopropyl | Isopropyl | Isopropyl |
| CH$_2$ | Isopropyl | Isopropyl | Methyl | H |
| CH$_2$ | Methoxy | Methoxy | Methyl | Methyl |
| O | Methyl | Methyl | H | H |
| O | Ethyl | Ethyl | H | H |
| O | Methyl | Methyl | H | H |
| O | Methyl | Methyl | Methyl | H |
| O | Methyl | Methyl | Ethyl | Ethyl |
| S | Methyl | Methyl | H | H |
| S | Ethyl | Ethyl | H | H |
| S | Methyl | Methyl | H | H |
| S | Methyl | Methyl | Methyl | Methyl |
| S | Ethyl | Ethyl | Ethyl | Ethyl |
| S | Methyl | Methyl | Ethyl | Ethyl |
| CO | Methyl | Methyl | Methyl | H |
| CO | Methyl | Methyl | H | H |
| CO | Methyl | Methyl | Methyl | Methyl |
| SO$_2$ | Methyl | Methyl | Ethyl | H |
| SO$_2$ | Methyl | Methyl | H | H |
| SO$_2$ | Methyl | Methyl | Methyl | Methyl |
| SO$_2$ | Ethyl | Ethyl | Methyl | Methyl |
| SO | Methyl | Methyl | Methyl | Methyl |
| SO | Methyl | Methyl | H | H |
| COO | Methyl | Methyl | H | H |
| COO | Methyl | Methyl | Methyl | Methyl |
| CONCH$_3$ | Methyl | Methyl | H | H |
| NCH$_3$ | Methyl | Methyl | Ethyl | Ethyl |
| NCH$_3$ | Methyl | Methyl | Methyl | Methyl |
| CONH | Methyl | Methyl | — | — |
| NH | Ethyl | Methyl | Ethyl | Methyl |
| NH | Methyl | Methyl | Methyl | Methyl |
| Si(Methyl)$_2$ | Methyl | Methyl | H | H |
| Si(Phenyl)$_2$ | Methyl | Methyl | Methyl | Methyl |
| Si(OMethyl)$_2$ | Ethyl | Ethyl | H | H |
| Si(OPhenyl)$_2$ | Methyl | Methyl | Methyl | Methyl |
| —OSi(Methyl)$_2$O— | Methyl | Methyl | Methyl | Methyl |
| Ethylene | Methyl | Methyl | H | H |
| Ethylene | Methyl | Methyl | Methyl | Methyl |
| Ethylene | Ethyl | Ethyl | H | H |
| Ethylene | Methyl | Methyl | Ethyl | Ethyl |
| Phenylene | Methyl | Methyl | Methyl | Methyl |
| Phenylene | Ethyl | Ethyl | H | H |
| (CH$_3$)$_2$C< | Methyl | Ethyl | Methyl | Ethyl |
| (CH$_3$)$_2$C< | Methyl | Methyl | Methyl | Methyl |
| (CF$_3$)$_2$C< | Methyl | Methyl | Methyl | Methyl |
| Direct bond | Methyl | Methyl | H | H |
| Direct bond | Methyl | Ethyl | Methyl | Ethyl |
| Direct bond | Methyl | Ethyl | Methyl | H |
| Direct bond | Ethyl | Ethyl | Ethyl | Ethyl |
| Direct bond | Methoxy | Methoxy | Methoxy | Methoxy |
| Direct bond | Isopropyl | Isopropyl | H | H |
| Direct bond | Methoxymethyl | Methoxymethyl | Methoxymethyl | Methoxymethyl |

X in formula III can also be an arylene radical which is unsubstituted or substituted by F or Cl. It can have the formula

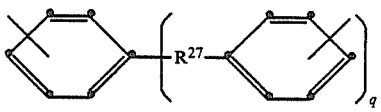

in which R$^{27}$ is a direct bond, —O—, —S—, —SO—, —SO$_2$— or —CO— and the free bonds are in the ortho- or para-position, and q is 0 or 1. Examples are m- or p-phenylene, 3,3'- or 4,4'-bisphenylene, 3,3'- or 4,4'-bisphenylene ether or thioether or -benzophenone and 3,3'-dichlorobenzidine.

It is known that some aliphatic and aromatic diamines, for example phenylenediamine or di(aminophenyl)methane, may promote the insolubility of polyimides. Such diamines are therefore preferably employed in smaller amounts. In particular, in this case, the structural elements of the formula I are present in amounts of at least 50 mol %, in particular 80 mol % and especially 90 mol %.

Z as a tetravalent aromatic radical preferably contains 6 to 30, in particular 6 to 20, C atoms. In a preferred sub-group, Z has the formula

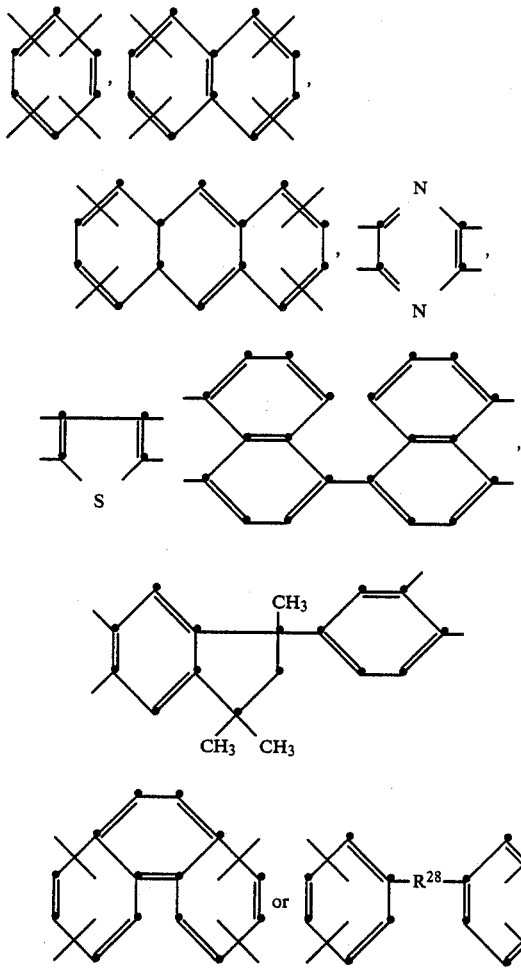

in which $R^{28}$ is a direct bond or a bridge group of the formula

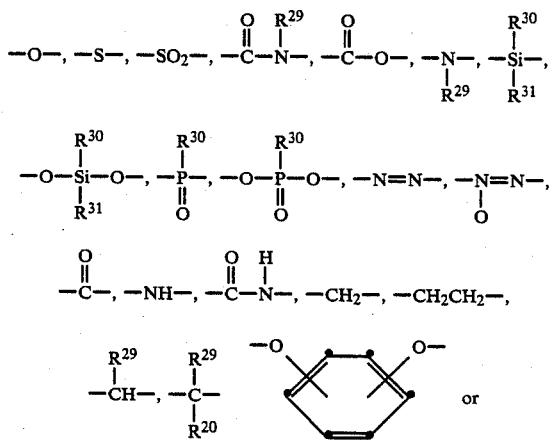

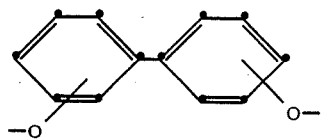

in which $R^{29}$, $R^{30}$ and $R^{31}$ are alkyl with 1 to 6 C atoms, phenyl or benzyl and $R^{30}$ and $R^{31}$ are alkoxy with 1 to 6 C atoms, phenyloxy or benzyloxy.

In the above formulae, in each case two of the free bonds are always in the peri- and/or ortho-position.

A preferred sub-group of Z are radicals of the formulae

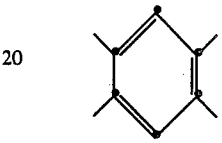

or

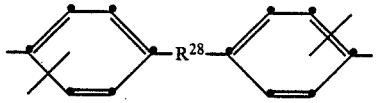

in which $R^{28}$ is a direct bond, —O—, —SO$_2$—, —CH$_2$— or, in particular, —CO—.

Especially preferred radicals are those of the formulae

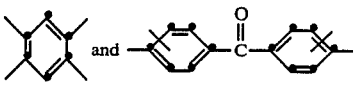

or mixtures thereof. The free bonds in the benzophenone radical are in the ortho-position.

Examples of tetracarboxylic acid anhydrides with a radical Z are: 2,3,9,10-perylenetetracarboxylic acid dianhydride, 1,4,5,8-naphthalenetetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, phenanthrene-1,8,9,10-tetracarboxylic acid dianhydride, pyromellitic acid dianhydride, 3,3',4,4'-biphenyltetracarboxylic acid dianhydride, 2,2',3,3'-biphenyltetracarboxylic acid dianhydride, 4,4'-isopropylidenediphthalic acid anhydride, 3,3'-isopropylidenediphthalic acid anhydride, 4,4'-oxydiphthalic acid anhydride, 4,4'-sulfonyldiphthalic acid anhydride, 3,3'-oxydiphthalic acid anhydride, 4,4'-methylenediphthalic acid anhydride, 4,4'-thiodiphthalic acid anhydride, 4,4'-ethylidenediphthalic acid anhydride, 2,3,6,7-naphthalenetetracarboxylic acid dianhydride, 1,2,4,5-naphthalenetetracarboxylic acid dianhydride, 1,2,5,6-naphthalenetetracarboxylic acid dianhydride, benzene-1,2,3,4-tetracarboxylic acid dianhydride, thiophene-2,3,4,5-tetracarboxylic acid dianhydride, 1-(3',4'-dicarboxyphenyl)-1,3,3-trimethylindane-5,6-dicarboxylic acid dianhydride, 1-(3',4'-dicarboxyphenyl)-1,3,3-trimethylindane-6,7-dicarboxylic acid dianhydride, 1-(3',4'-dicarboxyphenyl)-3-methylindane-5,6-dicarboxylic acid dianhydride, 1-(3',4'-dicarboxyphenyl)-3-methylindane-6,7-dicarboxylic acid dianhydride, 3,3',4,4'-benzophenonetetracarboxylic acid anhydride and 4,5,3',4'-benzophenonetetracarboxylic acid anhydride.

It has furthermore been found that a higher photosensitivity is achieved in copolyimides if Z is the tetravalent radical of an aromatic ketotetracarboxylic acid, and especially also if X is a substituted aromatic radical as defined above. Such copolyimides are a peferred subgroup. Radicals of such ketocarboxylic acids are present, in particular, if smaller amounts of structural elements of the formula I are present. A particularly preferred radical is

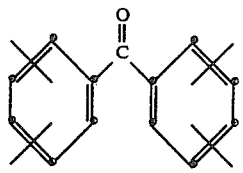

in which the free bonds are in the ortho-position relative to one another.

Other preferred radicals of ketocarboxylic acids have the formulae VIII to XI

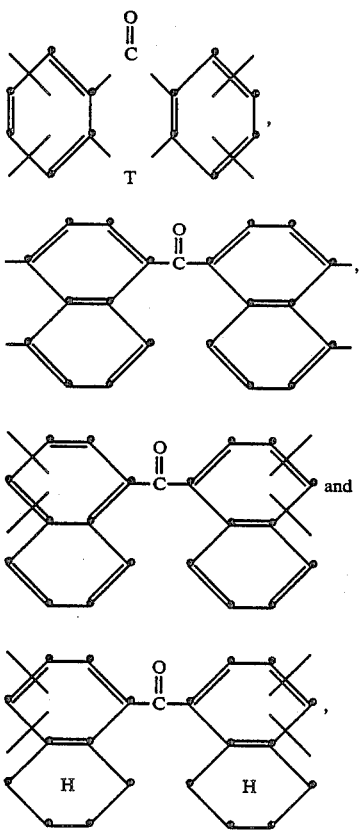

in which T is a direct bond, —S—, —O—, —CH₂—, —CO—, —NH—, —NR³²—, —SO—, —SO₂—, —CHR³²— or —CR³²R³³— and R³² and R³³ are C₁-C₆-alkyl, phenyl or benzyl, and the free bonds are in the ortho-position relative to one another.

Z' in formula IIIa is preferably a radical of the formula

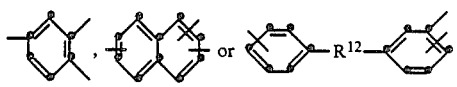

in which $R^{12}$ is a bridge group or a direct bond and two free bonds are in the ortho-position relative to one another. $R^{12}$ as a bridge group is preferably —O—, —S—, —CO— or —CH₂—, or alkylidene with 2 to 6 C atoms, cyclopentylidene or cyclohexylidene.

The present invention also relates to a process for the preparation of polyimides containing structural elements of the formula I according to claim 1, which comprises subjecting at least one aminodicarboxylic acid of the formula IV

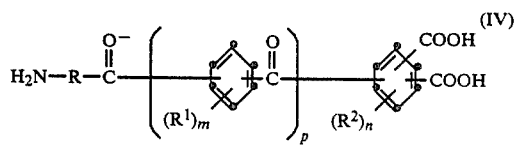

by itself or together with at least one aminodicarboxylic acid of the formula V

and/or at least one tetracarboxylic acid of the formula VI

or polyimide-forming derivatives thereof, and at least one diamine of the formula VII

in which R, R¹, R², Z, Z', X, m, n and p are as defined above, to polycondensation and cyclisation in a manner which is known per se.

Instead of the tetracarboxylic acids and aminodicarboxylic acids, it is also possible to use their polyimide-forming derivatives, for example their esters, amides, halides, in particular the chlorides, and anhydrides.

The aminodicarboxylic acids of the formula IV are novel and the present invention also relates to them. They can be obtained, for example, in the following manner:

Mellitic acid n-butylimide is converted with SO₂Cl₂ into

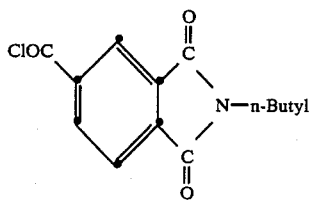

and this is reacted in the presence of AlCl$_3$ with

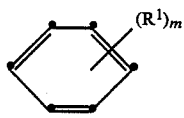

to give

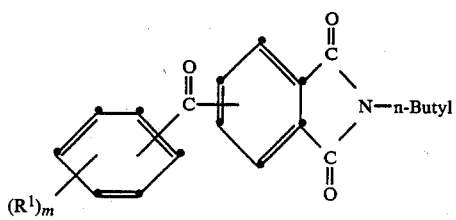

This compound is nitrated with HNO$_3$ and the nitro compound formed is hydrogenated catalytically to the desired amino compound

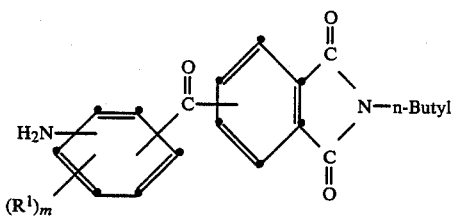

The imide can be converted into its acid derivatives in a known manner.

4,4'-Ketobis-(naphthalene-1,2-dicarboxylic acid) can be obtained by reacting 2 moles of 1,2-dimethylnaphthalene with COCl$_2$ in the presence of AlCl$_3$ and subsequently oxidising the 4,4'-ketobis(1,2-dimethylnaphthalene) formed with HNO$_3$ to give the tetracarboxylic acid. This tetracarboxylic acid can be partially hydrogenated to 4,4'-keto(tetrahydronaphthalene-1,2-dicarboxylic acid). The hydrogenation can also be carried out before the oxidation with 4,4'-ketobis(1,2-dimethylnaphthalene).

Tetracarboxylic acids with structural elements of the formula IV are known in some cases.

Anthraquinonetetracarboxylic acids are described, for example, in U.S. Pat. No. 3,702,318 and CA 100,1006119a (1984).

Hydrogenation of the keto groups in anthraquinonetetracarboxylic acids with, for examle, NaBH$_4$ gives the corresponding dihydroxy compound, which can be converted into anthronetetracarboxylic acid by treatment with hydrochloric acid under reflux. The CH$_2$ group of anthronetetracarboxylic acid can be alkylated in a known manner and thus converted into the CHR$^{32}$ or CR$^{32}$R$^{33}$ group.

To prepare fluorenonetetracarboxylic acid, for example, 3,4-dimethyl-magnesium bromide can be dimerised in the presence of CuCl$_2$ and the 3,3',4,4'-tetramethylbiphenyl formed can be reacted with COCl$_2$ in the presence of AlCl$_3$ to give tetramethylfluorenone, which can be oxidised to the tetracarboxylic acid in a known manner with, for example, HNO$_3$.

Xanthonetetracarboxylic acid is obtained by first converting 3,3',4,4-tetramethylphenyl ether into 2,3,6,7-tetramethylxanthone with CCl$_4$ in the presence of AlCl$_3$ and subsequent hydrolysis with dilute HCl, and oxidising the product to the tetracarboxylic acid in the customary manner, for example with HNO$_3$.

Tetracarboxylic acids with structural elements of the formula VIII in which T is S, SO, SO$_2$ or NR$^{32}$ can be obtained by the following route: 1-bromo-3,4-dimethylbenzene is reacted with CCl$_4$ in the presence of AlCl$_3$ to give bis(2-bromo-3,4-dimethylphenyl)dichloromethane. Oxidation with 20% HNO$_3$ gives

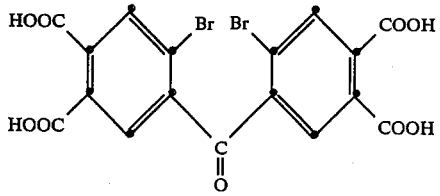

Reaction with Na$_2$S gives thioxanthonetetracarboxylic acid, which can be oxidised to the sulfoxide or sulfone in a known manner. Reaction with NaNH$_2$ or R$^{32}$NH$_2$ gives the acridonetetracarboxylic acids.

Aminodicarboxylic acids of the formula V and diamines of the formula VII, and tetracarboxylic acids of the formula VI are known, are commercially available or can be prepared by known processes. Si-containing diamines are described in U.S. Pat. Nos. 3,435,002 and 0,054,426. Diamines with the

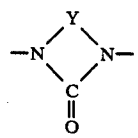

group can be prepared from the diisocyanates described in A-2,318,170. Diamines substituted by alkyl or cyclo alkyl, in particular ethyl or propyl, are accessible by alkylation of unsubstituted or partly substituted aromatic diamines with alkenes or cycloalkenes (c.f. U.S. Pat. No. 3,275,690). Polynuclear, especially dinuclear, aromatic diamines can be obtained via condensation of corresponding monoamines with aldehydes or ketones.

The polyimides according to the invention have average molecular weights (weight-average Mw) of at least 2,000, preferably at least 5,000. The upper limit depends largely on the properties which determine the processability, for example their solubility. It can be up to 500,000, preferably up to 100,000 and in particular up to 60,000. The polyimides can furthermore be random polyimides or block polyimides. They are prepared by customary processes in devices envisaged for this purpose. The reaction is advantageously carried out in solution; suitable inert solvents are listed below. The reaction temperatues can be −20° to 300° C.

Specifically, a procedure is advantageously followed in which the aminodicarboxylic acid anhydrides, tetracarboxylic acid dianhydride and diamine are first reacted to form a polyamide acid intermediate and this polyamide acid is then cyclised, water being detached. Cyclisation can be by means of heat. The cyclisation is advantageously carried out under the influence of dehydrating agents, for example carboxylic acid anhydrides, such as acetic anhydride. The polyimides can then be isolated by customary processes, for example by removal of the solvent or by precipitation by adding a non-solvent.

Another preparation method comprises reacting the tetracarboxylic acid dianhydride with a diisocyanate in one stage to give the polyimide.

The polyimides according to the invention are soluble in various solvents, if necessary with warming, and they have high glass transition points. They are outstandingly suitable for the production of films and protective coatings, and coating agents can be used from a solution of the polyimide in a solvent. The present invention also relates to the use of the polyimides according to the invention for the production of protective coatings and films.

To produce the coated material, the polymer or mixtures thereof is advantageously dissolved in a suitable organic solvent, if necessary with warming. Examples of suitable solvents are polar, aprotic solvents, which can be used by themselves or as mixtures of at least two solvents. Examples are: ethers, such as dibutyl ether, tetrahydrofuran, dioxane, methylene glycol, dimethylethylene glycol, dimethyldiethylene glycol, diethyldiethylene glycol and dimethyltriethylene glycol, halogenated hydrocarbons, such as methylene chloride, chloroform, 1,2-dichloroethane, 1,1,1-trichloroethane and 1,1,2,2-tetrachloroethane, carboxylic acid esters and lactones, such as ethyl acetate, methyl propionate, ethyl benzoate, 2-methoxyethyl acetate, $\gamma$-butyrolactone, o-valerolactene and pivalolactone, carboxylic acid amides and lactams, such as formamide, acetamide, N-methylformamide, N,N-dimethylformamide, N,N-diethylformamide, N,N-dimethylacetamide, N,N-diethylacetamide, $\gamma$-butyrolactam, $\epsilon$-caprolactam, N-methylpyrrolidone, N-acetylpyrrolidone, N-methylcaprolactam, tetramethylurea and hexamethylphosphoric acid amide, sulfoxides, such as dimethyl sulfoxide, sulfones, such as dimethyl sulfone, diethyl sulfone, trimethylene sulfone and tetramethylene sulfone, trimethylamine, triethylamine, N-methylpyrrolidine, N-methylpiperidine, N-methylmorpholine and substituted benzenes, such as chlorobenzene, nitrobenzene, phenols or cresols.

Undissolved constituents can be removed by filtration, preferably pressure filtration. The concentration of polymer in the coating agent thus obtained is preferably not more than 50% by weight, in particular not more than 30% by weight and especially not more than 20% by weight, based on the solution.

Other customary additives which donot adversely influence the photosensitivity can be incorporated during preparation of the solutions. Examples of these are matting agents, flow control agents, fine-particled fillers, flame-proofing agents, fluorescent brighteners, antioxidants, light stabilisers, stabilisers, dyes, pigments, adhesion promoters and antihalo-dyes, such as are described, for example, in U.S. Pat. No. 4,349,619.

The coating agent can be applied to suitable substrates or carrier materials by customary methods, such as dipping, brushing and spraying processes or by whirler, cascade and curtain coating. Examples of suitable substrates are plastics, metals and metal alloys, semimetals, semiconductors, glass, ceramics and other inorganic materials, for example $SiO_2$ and $Si_3N_4$. The solvent is then removed, if necessary by warming and if necessary in vacuo. Tack-free, dry, uniform films are obtained. The films applied can have coating thicknesses of up to about 500 $\mu$m or more, preferably from 0.5 to 500 $\mu$m and especially from 1 to 50 $\mu$m, depending on the application.

Protective films of such polyimides can be further modified by the action of radiation, increased heat stabilities, for example, thereby being possible. There is also the possibility of using such polyimides as photographic recording material for relief images. Additives such as sensitisers can be avoided by direct crosslinking under the influence of radiation, and the protective coatings and images have excellent electrical properties. The protective coatings and images are furthermore distinguished by their high heat stability and by only little shrinkage, if at all, when exposed to heat, which is of considerable advantage during use because virtually no distortion of the structures reproduced is observed.

The invention also relates to a carrier material coated with such polyimides and the use of this material for the production of protective coatings and photograhic relief images. The coating thickness for this application is preferably 0.5 to 100 $\mu$m, in particular 1 to 50 $\mu$m and especially 1-10 $\mu$m.

Photostructuring or photocrosslinking can be caused by high-energy radiation, for example by light, especially in the UV range, or by X-rays, laser light, electron beams and the like. The material according to the invention is outstandingly suitable for the production of protective films and passivating lacquers and as photographic recording material for heat-stable relief images.

Examples of fields of use are protective, insulating and passivating varnishes in electrical engineering and electronics, photo-masks for electronics, textile printing and the graphics industry, etch resists for the production of printed circuits and printed circuit boards and integrated switching circuits, relays for the production of X-ray masks, solder-stopping varnishes, dielectrics for multilayer circuits and structural elements for liquid crystal displays.

Protective films are produced by direct exposure, the exposure times largely depending on the coating thicknesses and the photosensitivity.

Photographic production of the relief structure is effected by image-wise exposure through a photo-mask and subsequent development, removing the non-exposed portions with a solvent or a solvent mixture, after which, if appropriate, the image produced can be stabilised by after-treatment with heat.

The invention also relates to such a process for the application of relief structures. The abovementioned solvents, for example, are suitable as developers.

The polymer coating of the material according to the invention has a photosensitivity which is sufficient for many application purposes and in some cases is high, and it can be photocrosslinked directly. The protective films and relief images are distinguished y a high adhesion and resistance to heat, mechanical stresses and chemicals. Only slight shrinkage is observed during after-treatment with heat. Additives for producing or increasing photosensitivity can furthermore be avoided. The material is stable on storage, but should advantageously be protected from the effect of light.

The following examples illustrate the invention in more detail. The glass transition temperatures are determined by differential scanning calorimetry.

(A) Preparation of the starting substances

Example (a) Preparation of

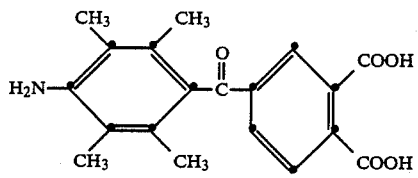

(1) 68.5 g of n-butylamine are added dropwise to a solution of 185 g of trimellitic anhydride in the course of 15 minutes. The mixture is then heated to the boiling point and some of the solvent is distilled off, together with the water of reaction. The solution which remains is poured into water and the product which has precipited is filtered off and dried.

The dry product is then heated to the reflux temperature with 265 ml of thionyl chloride in the course of one hour and the mixture is kept at this temperature for a further 2 hours. When the excess thionyl chloride has been removed by distillation, the residue is recrystallised from one liter of cyclohexane. The yield of pure trimellitic acid n-butylimide-chloride (A) is 168.9 g, melting point 77°–78° C.

(2) 15.5 g of Durol and 56 g of AlCl$_3$ in 150 ml of CS$_2$ are introduced into a flask and 28 g of A are added in portions in the course of 15 minutes. After one hour, the mixture is poured onto ice-water and 100 ml of concentrated HCl are added.

The organic layer is separated off, the aqueous layer is extracted with CH$_2$Cl$_2$ and the combined organic phases are washed with water, dried over Na$_2$SO$_4$ and evaporated to dryness. The residue is boiled up with 200 ml of ethanol, the mixture is filtered hot and the filtrate is cooled. 5-(2,3,5,6-Tetramethylbenzoyl)-phthalic acid n-butylimide (B) thereby precipitates as crystals. After filtering off and drying, 20.5 g of product B with a melting point of 127° C. are obtained.

Elemental analysis:

| | calculated | found |
| --- | --- | --- |
| C | 76.01 | 76.2 |
| H | 6.93 | 7.0 |
| N | 3.85 | 3.7 |
| O | 13.21 | 13.2 |

(3) 17 g of product b are added in portions to a mixture of 48 ml of concentrated H$_2$SO$_4$ and 40 ml of 65% HNO$_3$ at 0° to 2° C. When the addition has ended, the mixture is stirred at 0° C. for further 2 hours, the somewhat cloudy solution is filtered and the filtrate is poured onto ice-water. The 5-(4-nitro-2,3,5,6-tetramethylbenzoyl)phthalic acid N-butylimide (C) which has precipitated is filtered off, washed with water and dried, and, without further purification, is hydrogenated in dimethylformamide with hydrogen under catalysis by Raney nickel under atmospheric pressure.

The hydrogenation product is purified over a column 50 cm long and 10 cm thick filled with silica gel 60, using toluene/ethyl acetate (80/20) as the mobile phase.

8.9 g of 5-(4-amino-2,3,5,6-tetramethylbenzoyl)phthalic acid n-butylimide (D) are obtained.

(4) To prepare the free dicarboxylic acid, compound D is refluxed with alcoholic KOH for 24 hours. During this treatment, the potassium salt precipitates gradually as the hydrolysis progresses.

The potassium salt is filtered off and dissolved in water and 2N HCl is added until the isoelectric point (pH 5–6) is reached. The 5-(4-amino-2,3,5,6-tetramethylbenzoyl)phthalic acid (E) which thereby precipitates is filtered off and dried.

Elemental analysis:

| | calculated | found |
| --- | --- | --- |
| C | 66.85 | 65.66 |
| H | 5.61 | 5.89 |
| N | 4.10 | 4.12 |
| O | 23.44 | 24.01 |

(5) 1 g of aminodicarboxylic acid (E) is heated at 250° C. in vacuo for 10 hours, the corresponding anhydride (F) being formed, with water being detached.

Elemental analysis:

| | calculated | found |
| --- | --- | --- |
| C | 70.58 | 70.67 |
| H | 5.30 | 5.35 |
| N | 4.33 | 4.49 |
| O | 19.79 | 19.57 |

EXAMPLE 1

Polycondensation of E 0.5 g of E is dissolved in 5 ml of m-cresol and the solution is kept under reflux (about 205° C.) for 4 hours. The solution is cooled and the polyimide is precipitated with alcohol. The intrinsic viscosity is 0.41 dl/g.

EXAMPLE 2

0.5 g of aminoanhydride F is dissolved in 5 ml of N-methylpyrrolidone and the solution is stirred at room temperature for 16 hours.

0.5 ml of triethylamine and 1.3 ml of acetic anhydride are then added and the mixture is stirred for a further 24 hours.

The polymer is then precipitated by stirring into water and is dried.

Intrinsic viscosity: 0.32 dl/g

Glass transition temperature: 386° C. (differential scanning calorimetry).

EXAMPLE 3

1.642 g of 3,6-diaminodurol are dissolved in 22 ml of N-methylpyrrolidone (NMP) in a condensation vessel and 0.45 g of the aminoanhydride F is added, with stirring. After one hour, 3.22 g of benzophenonetetracarboxylic acid dianhydride (BTDA) are added. Five hors later, a further 32.2 mg of BTDA are added. After 2 hours, a mixture of 3 ml of triethylamine and 8.5 ml of acetic anhydride is added to the polyamide acid solution and stirring is continued for 20 hours. The polyimide is worked up by stirring the solution into water and filtering off and drying the product which precipitates.

Intrinsic viscosity: 1.04 dl/g

Tg: 430° C.

APPLICATION EXAMPLE

A thin film is produced on a sheet of plastic, which has been laminated with copper on one side, by whirling on a 10% solution of the polymer according to Example 1 in N-methylpyrrolidone and then removing the solvent in a circulating air oven. The sheet thus coated is then exposed through a photo-mask (Stouffer wedge) at room temperature with a UV lamp (1,000 watt) from a distance of 18 cm for 360 seconds.

The exposed sheet is developed with N-methylpyrrolidone, the non-exposed portions being dissolved away. The relief image is then rendered visible by etching away the exposed copper layer with $FeCl_3$ solution.

The photosensitivity according to the "21 step Stouffer sensitivity guide" is 4 steps.

The copolyimide according to Example 3 has a photosensitivity of 7–8 steps using the same method with an exposure time of 20 seconds.

What is claimed is:

1. An amino-tetraalkylbenzoylphthalic acid of the formula

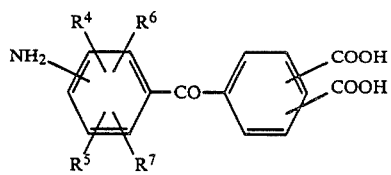

in which $R^4$, $R^5$, $R^6$ and $R^7$ are alkyl of 1 to 4 carbon atoms, or the polyimide forming derivatives thereof selected from the group consisting of the esters, amides, halides and anhydrides.

2. An acid according to claim 1 in which $R^4$, $R^5$, $R^6$ and $R^7$ are methyl or ethyl.

3. The acid according to claim 1 which is

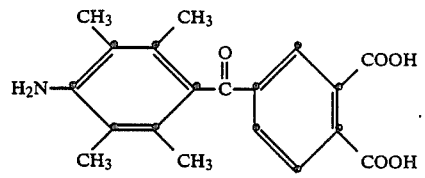

4. The acid anhydride according to claim 1 which is

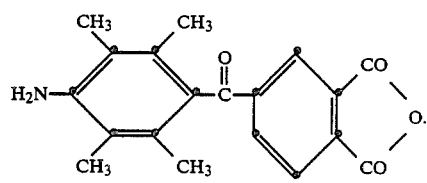

* * * * *